United States Patent [19]
Hongo et al.

[11] Patent Number: 5,455,460
[45] Date of Patent: Oct. 3, 1995

[54] SEMICONDUCTOR DEVICE HAVING COMPLIMENTARY BONDING PADS

[75] Inventors: Katsunobu Hongo; Hideki Shibutani, both of Hyogo, Japan

[73] Assignee: Mitsubishi Denki Kabishiki Kaisha, Tokyo, Japan

[21] Appl. No.: 178,344

[22] Filed: Jan. 6, 1994

Related U.S. Application Data

[63] Continuation of Ser. No. 862,011, Apr. 1, 1992, abandoned.

[30] Foreign Application Priority Data

Apr. 5, 1991 [JP] Japan ..................... 3-100366

[51] Int. Cl.⁶ ............... H01L 23/48; H01L 29/44; H01L 29/52
[52] U.S. Cl. ............ 257/734; 257/666; 257/784; 257/786
[58] Field of Search ................. 257/782, 783, 257/784, 786, 774, 666, 734

[56] References Cited

U.S. PATENT DOCUMENTS

| | | | |
|---|---|---|---|
| 4,223,337 | 9/1980 | Kojima et al. | 257/786 |
| 4,536,786 | 8/1985 | Hayakawa et al. | 257/786 |
| 4,951,098 | 8/1990 | Albergo et al. | 257/774 |

*Primary Examiner*—Sara W. Crane
*Assistant Examiner*—Carl Whitehead, Jr.
*Attorney, Agent, or Firm*—Townsend and Townsend and Crew

[57] ABSTRACT

Among a plurality of pads disposed along four sides of a semiconductor chip, complementary pads connected to individual pads by conductors are provided for the pads situated near the corners of the semiconductor chip to allow different types of packages to be used with the single semiconductor chip.

15 Claims, 4 Drawing Sheets

SEMICONDUCTOR DEVICE HAVING COMPLIMENTARY BONDING PADS

This application is a continuation application of Ser. No. 07/862,011 filed Apr. 1, 1992 (now abandoned).

BACKGROUND OF THE INVENTION

1. Field of the Invention

The present invention relates to a semiconductor device, and more particularly to pads on a chip for bonding frame leads of a package to the chip.

2. Description of the Prior Art

FIG. 5 is a diagram showing an example of a conventional semiconductor device. As apparent from FIG. 5, on a quadrangular semiconductor chip 2 arranged on a die pad 1, a plurality of pads 3 are disposed along the four sides thereof. Pads 3 are connected with driver circuits 4, 4 which are consisted, for example, of N-channel MOS transistor and P-channel MOS transistor arranged on both sides of pad 3 by printed conductors 5. Also, peripheral circuits 6 are arranged on one side of driver circuit 4.

On the other hand, frame leads 7 made of copper alloy and the like, which will be terminals of packages, are disposed on outside of the die pad 1. Frame leads 7 are connected electrically with the pads 3 by leads 8 made of gold and the like. That is, a single pad 3 on semiconductor chip 2 corresponds to a single lead 7, and each frame lead 7 is made most suitably by taking form and size of the package, magnitude of semiconductor chip 2 and position of the pad 3 into consideration.

Since the conventional semiconductor device is constructed as the above description, when plural types of package are to be used with one type of semiconductor chip 2, for example, if the chip is small in size, frame lead 7 should be long and the tip of lead 7 is to be made thin so as to arrange finely. However, in this case, since there is a case where lead 7 cannot be manufactured in respect with the thickness of the frame, feasible positions and forms of the tip of lead 7 are restricted dependent on each frame. Accordingly, there is a limit to approximate the tip of lead 7 to semiconductor chip 2. Moreover, the length and the angle of the wiring are also limited, so that a frame lead which is optimum for arranging pad 3 cannot be manufactured, and particularly, bonding at the corners of semiconductor chip 2 cannot be performed. In addition, there is the same problem in a case where the molding is performed by decreasing number of terminals without using all pads 3 on semiconductor chip 2.

SUMMARY OF THE INVENTION

The object of the present invention, in view of the above-mentioned problems, is to provide a semiconductor device wherein packages of plural types can be used with a semiconductor chip of one type.

For this end, the semiconductor device of the present invention is provided with complementary pads in respect to pads at around the corners of a semiconductor chip, and the pads are connected with the complementary pads by conductors.

The above and other objects, features, and advantages of the invention will become more apparent from the following description when taken in conjunction with the accompanying drawings.

DESCRIPTION OF THE PREFERRED EMBODIMENT

Figure 1:
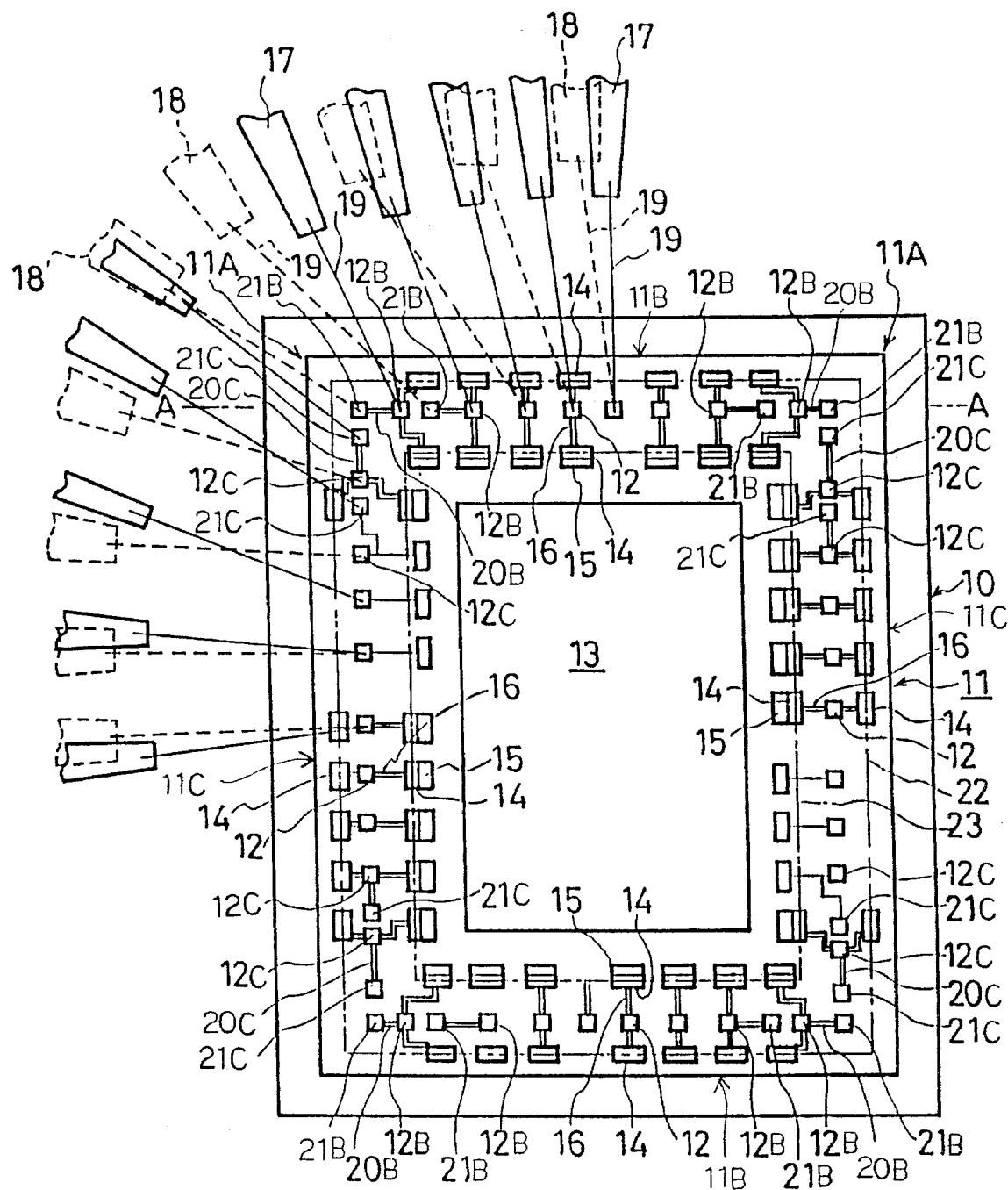
FIG. 1 is a plan view showing an embodiment of a semiconductor device according to the present invention.

Embodiments of the present invention will be explained in detail hereinafter referring to the drawings.

Figure 2:
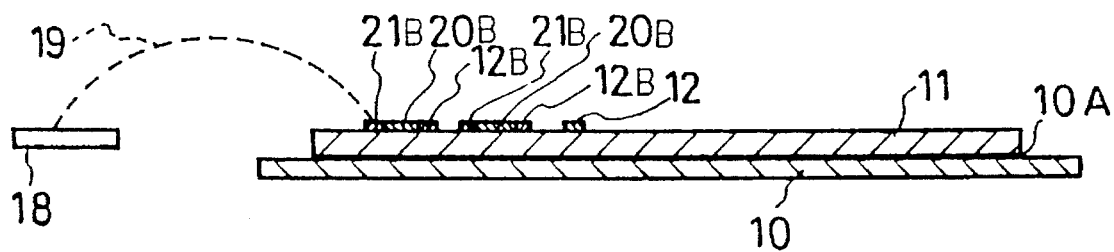
FIG. 2 is a sectional view taken along line A—A of FIG. 1.
Figure 3:
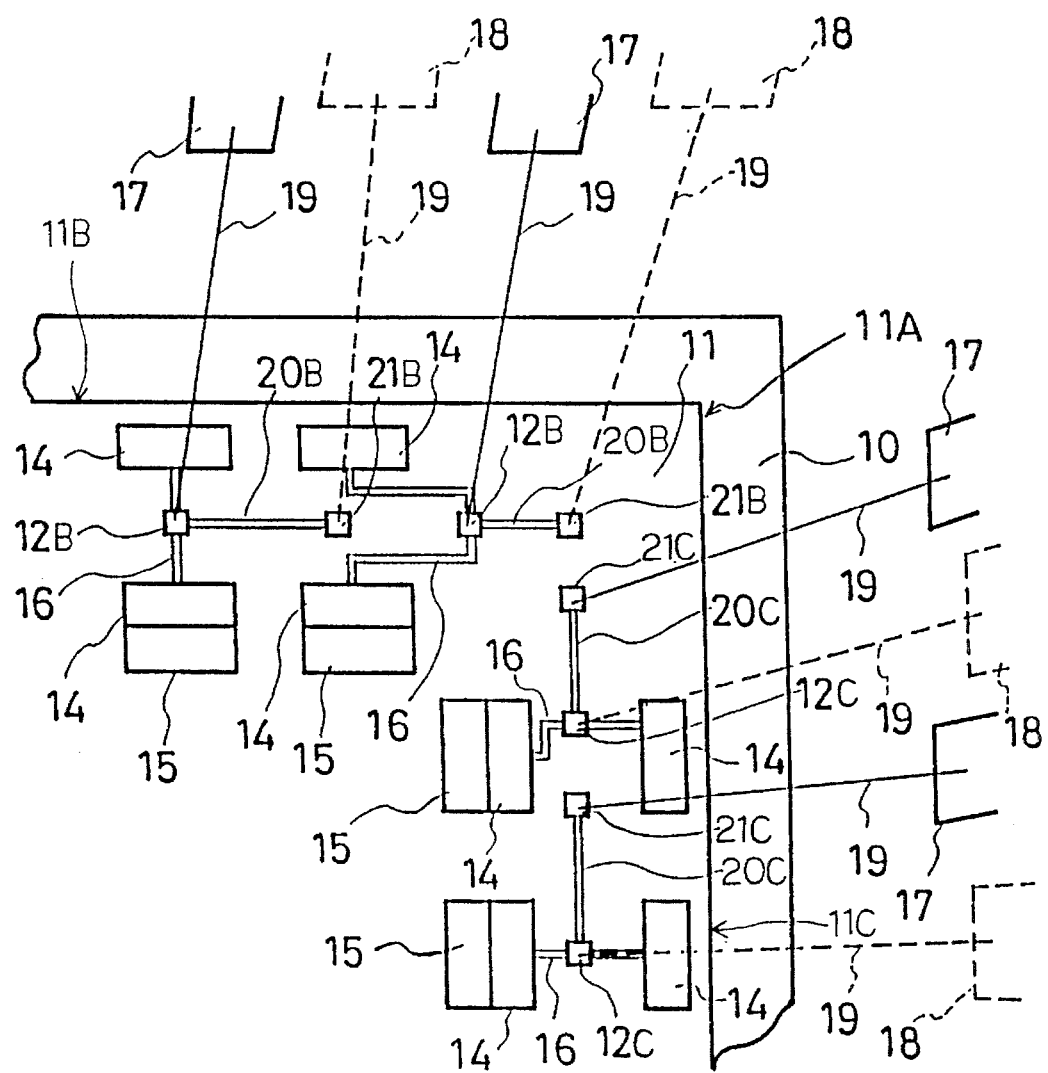
FIG. 3 is an enlarged plan view of main part of the semiconductor device.

FIG. 1 is a plan view showing an embodiment of the semiconductor device according to the present invention, FIG. 2 is a sectional view taken along line A—A of FIG. 1, and FIG. 3 is an enlarged plan view of main part of the semiconductor device of the FIG. 3.

Referring to Figs., a quadrangular semiconductor chip 11 is arranged securely on a die pad 10 by a solder 10A. A plurality of pads 12 are disposed along four sides of semiconductor chip 11. Also, on semiconductor chip 11, a plurality of circuits are formed. That is, in the present embodiment, an inner circuit 13, driver circuits 14, 14 and peripheral circuits 15 connected to inside driver circuit 14 are formed. Driver circuits 14, 14 include, for example, an N-channel MOS transistor and a P-channel MOS transistor and are arranged on opposing sides of pads 12. Driver circuits 14, 14 are connected to pads 12 through conductors 16. Numerals 17 represent frame leads which will be terminals of a first package formed in a thin flat-shaped package and numerals 18 represent frame leads which will be terminals of a second package formed in a lip type package. Frame leads 17 and 18 are extended toward the central portion of semiconductor chip 11 from outside of semiconductor chip 11. The tips of frame leads 17 and 18 are constructed opposing to the outer periphery of semiconductor chip 11. Frame leads 17 and 18 are connected with pads 12 by leads 19 made of gold and the like.

Among plural pads 12, pads 12B situated along edges 11B and near corners 11A of semiconductor chip 11 are connected with complementary pads 21B by conductors 20B. Also, pads 12C situated along edges 11C and near corners 11A of semiconductor chip 11 are connected with complementary pads 21C by conductors 20C. Complementary pads 21B and 21C are provided only at around corners 11A of semiconductor chip 11, they are not provided for pads 12 at the central portions of semiconductor chip 11.

The positions of pads 12B and 12C and complementary pads 21B and 21C near corners 11A are decided through patterns of conductors 16 and 20B and 20C in such a manner that they fit the shapes of frame leads feasible by the first and second package, respectively. Further, as understood by those of ordinary skill in the art, the length of conductors 20B and 20C that connect the pads 12B and 12C with complementary pads 21B and 21C, respectively, cannot be made too long on semiconductor chip 11 Thus, their length is to be within several times of the diameter of the pad. Numeral 22 in FIG. 1 denotes a gland line and numeral 23 denotes a power line.

Thus, according to the structure of the present invention, since a plurality of pads (pads 12B and complementary pads 21B or pads 12C and corresponding to one terminal are provided near corners 11A of semiconductor chip 11, a plurality of package types can be used with semiconductor chip 11 of one type. That is, connecting pads 12B and complementary pads 21B and connecting pads 12C and complimentary pads 21C can be selected optionally for bonding by the variously formed frame leads of plural types. Accordingly, the limit around corners 11A of the semiconductor chip 11 which had been particularly severe can be relieved.

The intervals between pads 12B and 12C and respective complementary pads 21B and 21C are arranged to be within several times the diameter of the pad, so that the electrical characteristic of the semiconductor device does not change depending on whether pads 12B and 12C or complementary pads 21B and 21C are used.

Figure 4:
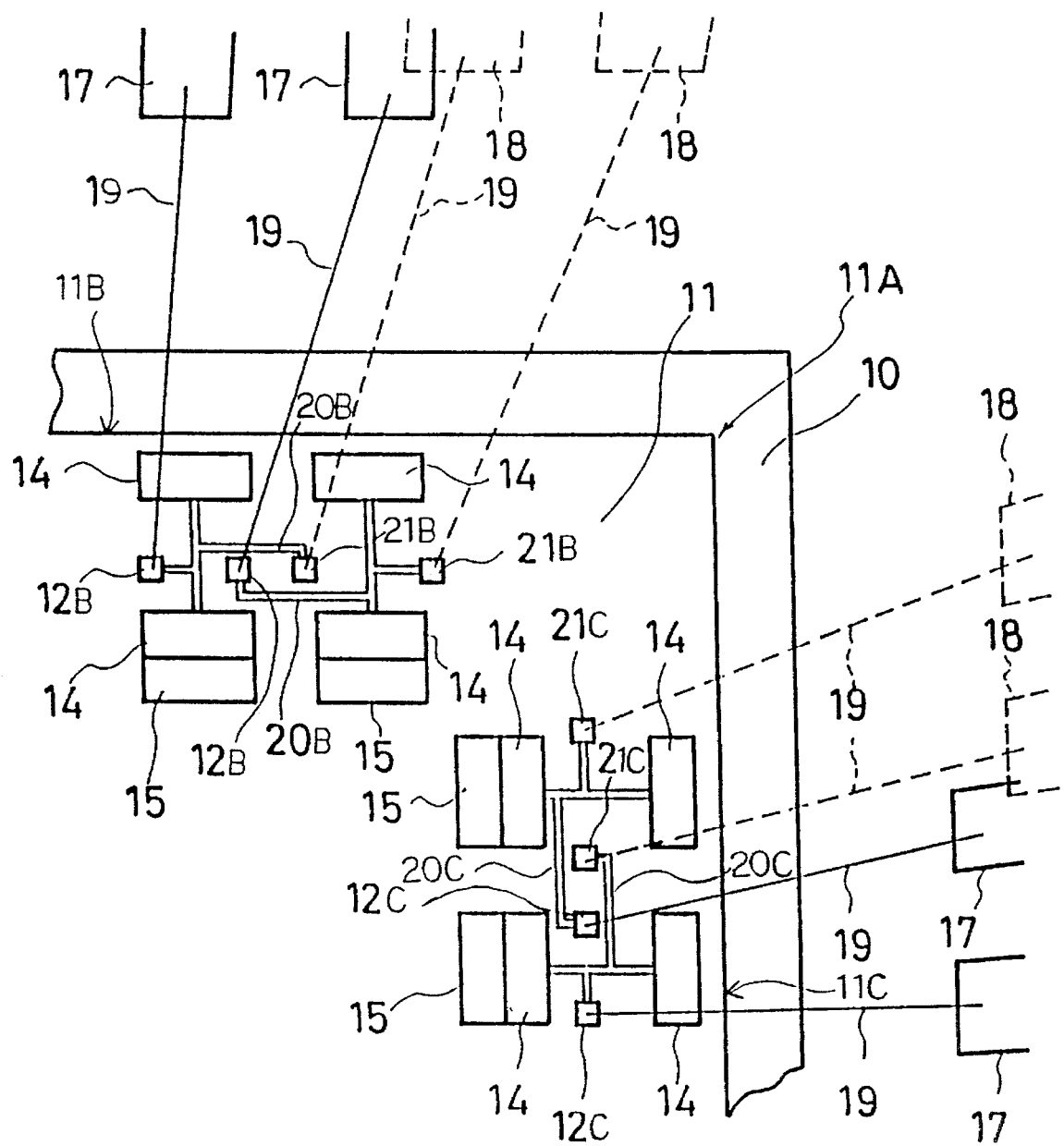
FIG. 4 is an enlarged plan view of main part of other embodiment of the semiconductor device according to the present invention.
Figure 5:
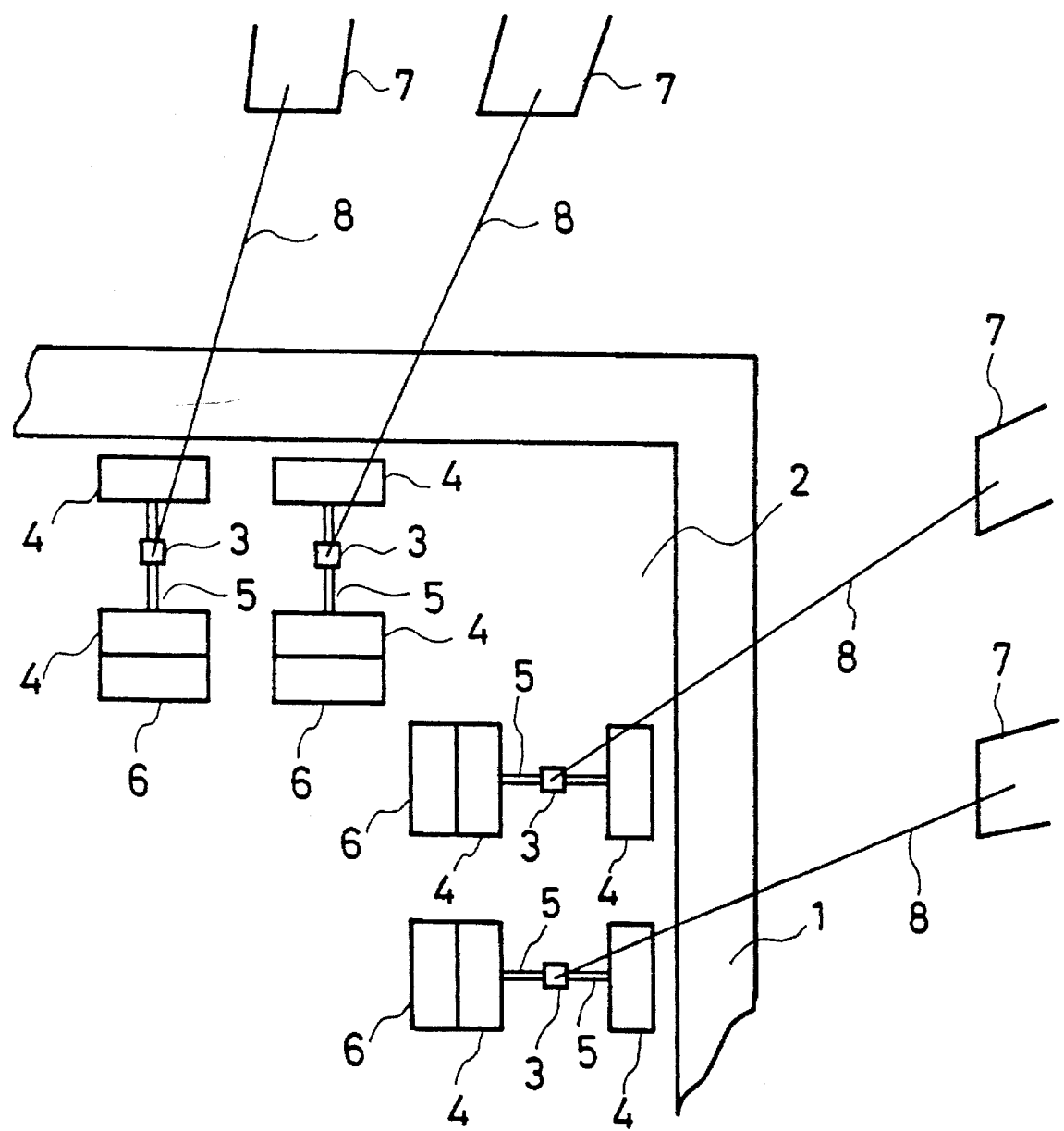
FIG. 5 is a partial enlarged plan view showing a conventional semiconductor device.

FIG. 4 shows another embodiment of the semiconductor device according to the present invention. Thus, by changing the pattern of conductors 20B and 20C, the positions of pads 12B and 12C and complementary pads 21B and 21C can be changed to an optimum structural arrangement depending on the type of package to be mounted. Other structures, for example, in respect to die pad 10, semiconductor chip 11, driver circuits 14, peripheral circuits 15, frame leads 17 and 18 of the first and second packages and leads 19 are the same as the above described first embodiment, so that the explanation thereof will be omitted.

In the above mentioned embodiment, although there are two pads which correspond to one terminal, it is not restricted to two pads. Needless to say, any number of pads greater than one can be used.

According to the present invention, as described above, complementary pads are provided for pads near the corners of the semiconductor chip and the pads are connected to the complementary pads by conductors. Thus, there is an advantage that different types of packages can be used with a single semiconductor chip design.

What is claimed is:

1. A semiconductor chip having a first edge, a second edge substantially perpendicular to said first edge, and a corner where said first edge intersects said second edge, said semiconductor chip being arranged on a die pad and having a plurality of circuit elements formed therein, and said semiconductor chip comprising:

a first bonding terminal disposed near said corner and selectively coupled to said circuit elements, said first bonding terminal comprising first and second electrode pads disposed along a first pathway substantially parallel to said first edge, said second electrode pad disposed between said first electrode pad and said second edge and coupled to said first electrode pad; and a second bonding terminal disposed near said corner and selectively coupled to said circuit elements, said second bonding terminal comprising third and fourth electrode pads disposed along a second pathway substantially parallel to said second edge, said second pathway intersecting said first pathway at a point disposed near said corner, said fourth electrode pad being disposed between said third electrode pad and said first edge and coupled to said third electrode pad.

2. A semiconductor device comprising:

(a) a semiconductor chip having a first edge, a second edge substantially perpendicular to said first edge, and a corner where said first edge intersects said second edge, said semiconductor chip being arranged on a die pad and having a plurality of circuit elements formed therein, and said semiconductor chip including:

a first bonding terminal disposed near said corner and selectively coupled to said circuit elements, said first bonding terminal comprising first and second electrode pads disposed along a first pathway substantially parallel to said first edge, said second electrode pad disposed between said first electrode pad and said second edge and coupled to said first electrode pad; and a second bonding terminal disposed near said corner and selectively coupled to said circuit elements, said second bonding terminal comprising third and fourth electrode pads disposed along a second pathway substantially parallel to said second edge, said second pathway intersecting said first pathway at a point disposed near said corner, said fourth electrode pad being disposed between said third electrode pad and said first edge and coupled to said third electrode pad;

(b) a plurality of frame leads disposed on an external housing package, each lead having a tip and each lead extending from outside said semiconductor chip toward the center of said semiconductor chip with said tip opposing the outer periphery of said semiconductor chip;

(c) a plurality of first leads made of a conductive metal for selectively coupling said first electrode pad or said second electrode pad of said first bonding terminal to said frame leads; and (d) a plurality of second leads made of said conductive metal for selectively coupling said third electrode pad or said fourth electrode pad of said second bonding terminal to said frame leads.

3. The semiconductor device of claim 2 wherein said conductive metal is gold.

4. The semiconductor device of claim 2 wherein:

said first and second electrode pads and said third and fourth electrode pads are coupled by conductive paths having a specific length;

each of said first, second, third, and fourth electrode pads have a specific diameter; and said specific length of said conductive paths is less than several times said specific diameter of said first, second, third, and fourth electrode pads.

5. A semiconductor device comprising:

a semiconductor chip having a first edge, a second edge substantially perpendicular to said first edge, a corner where said first edge intersects said second edge, and a plurality of circuit elements;

a plurality of first electrode pads situated near and substantially parallel to said first edge of said semiconductor chip and selectively coupled to said circuit elements, said plurality of first electrode pads forming a first arrangement of electrode pads along said first edge;

a plurality of second electrode pads situated near and substantially parallel to said second edge of said semiconductor chip and selectively coupled to said circuit elements, said plurality of second electrode pads forming a second arrangement of electrode pads along said second edge;

a first auxiliary electrode pad disposed near said corner of said semiconductor chip and coupled to one of said plurality of first electrode pads said that is situated at an end of the first arrangement of electrode pads by a thin conductive path; and a second auxiliary electrode pad disposed near said corner of said semiconductor chip, electrically separated from said first auxiliary electrode pad, and coupled to one of said plurality of second electrode pads at an end of the Second arrangement of electrode pads.

6. A semiconductor device according to claim 5 further comprising a lead frame, wherein said lead frame disposed on an external housing package comprises a plurality of leads extending from outside said semiconductor chip toward the center of said semiconductor chip; and the plurality of said leads are made of a conductive metal for coupling the pluralities of said first and second electrode pads to said lead frame.

7. A semiconductor device according to claim 5 further comprising a lead frame, wherein said lead frame disposed on an external housing package comprises a plurality of leads extending from outside said semiconductor chip toward the center of said semiconductor chip; and the plurality of said leads are made of a conductive metal for coupling the pluralities of said first and second electrode pads and said first and second auxiliary electrode pads to said lead frame.

8. A semiconductor device according to claim 5 comprising third and fourth auxiliary electrode pads, wherein said third auxiliary pad is situated between a first electrode pad at the end of the first arrangement of electrode pads and another first electrode pad adjacent to said first electrode pad at the end of the first arrangement, and coupled to said another first electrode pad by a conductive path; and said fourth auxiliary electrode pad is situated between a second electrode pad at the end of the second arrangement of electrode pads and another second electrode pad adjacent to said second electrode pad at the end of the second arrangement and coupled to said another second electrode pad by a conductive path.

9. A semiconductor device according to claim 8 further comprising a lead frame, wherein said lead frame disposed on an external housing package comprises a plurality of leads extending from outside said semiconductor chip toward the center of said semiconductor chip; and the plurality of said leads are made of a conductive metal for coupling the pluralities of said first and second electrode pads to said lead frame.

10. A semiconductor device according to claim 8 further comprising a lead frame, wherein said lead frame disposed on an external housing package comprises a plurality of leads extending from outside said semiconductor chip toward the center of said semiconductor chip; and the plurality of said leads are made of a conductive metal for coupling the pluralities of said first and second electrode pads and said first, second, third-and fourth auxiliary electrode pads to said lead frame.

11. A semiconductor device according to claims 6, 7, 9 or 10, wherein said conductive metal is gold.

12. A semiconductor device according to claim 5, wherein said conductive paths have a specific length;

said first and second electrode pads and said first and second auxiliary electrode pads have a specific diameter; and said specific length of said conductive paths is less than several times said specific diameter of said first and second electrode pads and said first and second auxiliary electrode pads.

13. A semiconductor device according to claim 8, wherein said conductive paths have a specific length;

said first and second electrode pads and said first, second, third and fourth auxiliary electrode pads have a specific diameter; and said specific length of said conductive paths is less than several times said specific diameter of said first and second electrode pads and said first, second, third and fourth auxiliary electrode pads.

14. A semiconductor chip comprising a first edge, a second edge substantially perpendicular to said first edge, a corner where said first edge intersects said second edge, a plurality of circuit elements, and first and second bonding terminals, wherein said first bonding terminal disposed near said corner comprises a first electrode pad and a first auxiliary electrode pad disposed substantially parallel to said first edge;

said first auxiliary electrode pad is situated between said first electrode pad and said second edge of said semiconductor chip;

said second bonding terminal disposed near said corner comprises a second electrode pad and a second auxiliary electrode pad disposed substantially parallel to said second edge;

said second auxiliary electrode pad is situated between said second electrode pad and said first edge of said semiconductor chip.

15. A semiconductor chip comprising a first edge, a second edge substantially perpendicular to said first edge, a corner where said first edge intersects said second edge, a plurality of circuit elements, and first, second, third and fourth bonding terminals, wherein said first bonding terminal disposed near said corner comprises a first electrode pad and a first auxiliary electrode pad disposed substantially parallel to said first edge;

said first auxiliary electrode pad is situated between said first electrode pad and said second edge of said semiconductor chip;

said second bonding terminal disposed near said corner comprises a second electrode pad and a second auxiliary electrode pad disposed substantially parallel to said second edge;

said second auxiliary electrode pad is situated between said second electrode pad and said first edge of said semiconductor chip;

another one of said leads of said lead frame is coupled to either said second electrode pad or said second auxiliary electrode pad when said semiconductor chip is bonded in one of said housing packages;

said third bonding terminal disposed near said corner comprises a first electrode pad and a third auxiliary electrode pad disposed substantially parallel to said first edge;

said third auxiliary electrode pad is situated between said first bonding terminal and said first electrode pad;

another one of said leads of said lead frame is coupled to either said first electrode pad or said third auxiliary electrode pad when said semiconductor chip is bonded in one of said-housing packages;

said fourth bonding terminal disposed near said corner comprises a second electrode pad and a fourth auxiliary electrode pad disposed substantially parallel to said second edge;

said fourth auxiliary electrode pad is situated between said second bonding terminal and said second electrode pad.

* * * * *